United States Patent [19]

Carlson

[11] 4,231,886

[45] Nov. 4, 1980

[54] ESTER SOLUTIONS OF COMPLEX SALTS

[75] Inventor: Robert C. Carlson, Hudson, Wis.

[73] Assignee: Minnesota Mining and Manufacturing Company, St. Paul, Minn.

[21] Appl. No.: 7,667

[22] Filed: Jan. 29, 1979

[51] Int. Cl.$^3$ ............................................. B01J 31/02
[52] U.S. Cl. .................................... 252/117; 430/270; 430/280; 204/159.18; 204/159.24
[58] Field of Search ............ 95/426; 96/115 R, 115 P; 204/159.18, 159.24; 430/280, 270

[56] References Cited

U.S. PATENT DOCUMENTS

| 4,058,400 | 11/1977 | Crivello | 96/86 P |
|---|---|---|---|
| 4,058,401 | 11/1977 | Crivello | 96/115 R |
| 4,069,055 | 1/1978 | Crivello | 96/115 R |
| 4,102,687 | 7/1978 | Crivello | 96/115 R |
| 4,139,385 | 1/1979 | Crivello | 96/115 R |
| 4,156,035 | 5/1979 | Tsao et al. | 96/115 R |

*Primary Examiner*—Jack P. Brammer
*Attorney, Agent, or Firm*—C. Alexander; D. M. Sell; D. P. Edmundson

[57] ABSTRACT

Compositions are provided comprising complex salts dissolved in liquid organic esters in amounts of at least 10% by weight. The compositions provide a concentrated liquid form of complex salt for use as photoinitiator in polymerization reactions.

7 Claims, No Drawings

ESTER SOLUTIONS OF COMPLEX SALTS

BACKGROUND OF THE INVENTION

This invention relates to liquid compositions. More particularly, this invention relates to liquid compositions containing photodecomposable complex salts.

In assignee's copending application Ser. No. 609,898, filed Sept. 2, 1975, incorporated herein by reference, there is described a photocopolymerizable compositions containing (a) an organic material containing expoxide functionality, (b) an organic material having hydroxyl functionality, and (c) a complex salt photoinitiator selected from aromatic iodonium complex salts and aromatic sulfonium complex salts. Such photocopolymerizable compositions are very useful for providing cured coatings on a variety of substrates for decorative or protective reasons. Such compositions are typically coated and cured by the manufacturer of the finished article, e.g. beverage can, label stock, coated paper, etc. Each such user of these compositions typically specifies the particular physical characteristics which the curable composition, and the cured coating, must exhibit for his particular applications (e.g. color, chemical resistance, coating characteristics, etc.).

Although such photocopolymerizable compositions may be formulated by each industrial user so as to meet his specific requirements, it is much more common for such compositions to be prepared by coating formulators who specialize in the preparation of coating compositions for industrial use. The coating formulators must procure the various necessary ingredients (e.g. base resins, colorants, viscosity modifiers, curatives, etc.) from a number of different sources. With respect to the photocopolymerizable compositions referred to above, it would be highly desirable to be able to supply the coating formulator with a concentrated solution of the complex salt photoinitiator in a form which would permit ready addition to, and compatibility with, a variety of different coating compositions (particularly those which are based on cationically polymerizable materials).

In an earlier filed application, Ser. No. 876,115, there is suggested the use of certain neutral oxyethylene-containing material as a solvent for certain sulfonium complex salts. Although such compositions claimed therein are quite useful there are some limitations with respect to the use thereof. For example, concentrated solutions of aromatic iodonium complex salts in such solvents have limited shelf life. The oxyethylene-containing materials generally have marked affinity for water therefore requiring particular care in the preparation of the complex salt solution to insure absence of all water and caution on the part of the coating formulator in the handling of the complex salt solutions.

SUMMARY OF THE INVENTION

In accordance with the present invention there is provided a composition comprising a complex salt dissolved in a liquid organic ester in an amount of at least 10% by weight. The complex salt may be either a diorganoiodonium complex salt or a triorganosulfonium complex salt.

The liquid organic esters used herein are of low viscosity and accordingly the complex salt solutions are readily blended with the desired photopolymerizable materials. Further, these organic esters have low affinity for water and, accordingly, simplified procedures may be used in the preparation of the complex salt solutions of this invention. Low affinity for water is particularly important in applications such as photocurable inks and varnishes to be applied by wet lithography. Also, the organic esters are solvents for the diorganoiodonium complex salts and form shelf stable solutions thereof (i.e. solutions are stable over a long period, e.g. one year or more at ambient temperatures). Moreover, the organic esters described herein readily dissolve the complex salts in amounts from 10 to 50% or more by weight, thereby assuring that only a minor amount of solvent need be present in a final formulation containing the required amount of complex salt.

DETAILED DESCRIPTION OF THE INVENTION

The compositions of the invention contain, as the liquid medium, one or more liquid organic esters. Preferably, the esters used herein are esters of (a) aromatic or aliphatic polycarboxylic acid, and (b) aliphatic alcohols.

More preferably, the esters used herein are derived from (a) phthalic acid, and (b) an aliphatic alcohol having an oxygen to carbon ratio of at least 1:4; when the oxygen to carbon ratio is 1:4 the alcohol must be a straight chain. Another useful type of ester is that derived from (a) an aliphatic acid having at least two carboxyl groups linked directly or by means of a chain havng 1 or 2 carbon atoms (if the two carbon atoms are unsaturated then the carboxyl groups should be in the cis-position), and (b) an aliphatic alcohol having an oxygen to carbon ratio of at least 1:3.

The preferred liquid organic esters used herein are derived from phthalic acid (when the two carboxylic groups are in the ortho position). The aliphatic alcohol used to prepare this type of ester has an oxygen to carbon ratio of at least 1:4. These alcohols are monofunctional and may have only carbon atoms in the skeletal chain or may have oxygen and carbon atoms therein. Representative alcohols would include methanol, ethanol, isopropanol, 3-chloropropanol, allyl alcohol, 2-methoxyethanol, 5,8-dioxodecanol, and the like.

Mixed organic esters (e.g. where one ester group of the phthalate is derived from benzyl alcohol and the other ester group is derived from an aliphatic alcohol having an oxygen to carbon ratio of at least 1:4) are also useful in the present invention.

The aliphatic acids useful for making esters herein are those having at least two carboxylic groups linked directly or by means of a chain having 1 to 4, preferably 1 or 2, carbon atoms. Representative aliphatic acids include oxalic, malonic, maleic, succinic, oxydiacetic, glutaric, tricarballylic, 2-bromoglutaric, 3-methylglutaric, and the like. The aliphatic alcohol useful in making these esters has an oxygen to carbon ratio of at least 1:3. Suitable representative examples include methanol, ethanol, isopropanol, 2-ethoxyethanol, beta-chloroethanol, and the like.

The organic esters which have been described hereinbefore may be substituted or unsubstituted. If they are substituted the substituents must be neutral, i.e. neither strongly basic nor strongly acidic, and the ester must be free of epoxy-reactive groups (viz, any group that reacts with 1,2-oxirane compounds at temperature of use) such as carboxyl and hydroxyl groups. Suitable substituents would include halogen, alkyl, aryl, and the like.

Mixtures of organic esters may also be used, if desired. For example, to adjust viscosity one may desire the use of mixtures.

The liquid organic esters useful herein are generally not co-reactive with cationically polymerizable materials. Esters boiling below about 150° C. may partially or completely volatilize during the photocuring of compositions to which the concentrated photoinitiator solution has been added. Such volatile ester generally contributes very little to pollution because of the very small amount of such ester present in such curable compositions. Where substantially complete avoidance of volatile effluent is desired esters boiling above about 175° C. are preferred.

The complex salts useful in the practice of the present invention include diorganoiodonium complex salts and triorganosulfonium complex salts. The diorganoiodonium complex salts may be generally represented by the formula

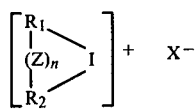

and the useful triorganosulfonium complex salts may be generally represented by the formula:

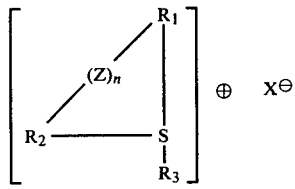

wherein in each of the above formulas $R_1$, $R_2$, and $R_3$ can be the same or different, and such groups are selected from aromatic groups having 4 to 20 carbon atoms (e.g. substituted and unsubstituted phenyl, thienyl, and furanyl), Z is selected from the group consisting of oxygen; sulfur;

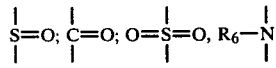

where $R_6$ is aryl (of 6 to 20 carbons, such as phenyl) or acyl (of 2 to 20 carbons, such as acetyl, benzoyl, etc.); a carbon-to-carbon bond; or

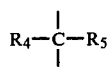

where $R_4$ and $R_5$ are selected from the group consisting of hydrogen, an alkyl radical having 1 to 4 carbon atoms, and an alkenyl radical having 2 to 4 carbon atoms; and n is zero or 1; and $X^{31}$ is a halogen-containing complex anion selected from the group consisting of tetrafluoroborate, hexafluorophosphate, hexafluoroarsenate, and hexafluoroantimonate.

The aromatic iodonium cations are stable and are well known and recognized in the art. See for example, U.S. Pat. Nos. 3,565,906; 3,712,920; 3,759,989; and 3,763,187; F. Beringer, et al., Diaryliodonium Salts IX, J. Am. Chem. Soc. 81, 342–51 (1959) and F. Beringer, et al., Diaryliodonium Salts XXIII, J. Chem. Soc. 1964, 442–51; F. Beringer, et al., Iodionium Salts Containing Heterocyclic Iodine, J. Org. Chem. 30, 1141–8 (1965).

The aromatic iodonium complex salts may be prepared by metathesis of corresponding aromatic iodonium simple salts (such as, for example, the diphenyliodonium bisulfate) in accordance with the teachings of Beringer, et al., J. Am. Chem. Soc. 81, 342 (1959) or the free acid. Additional details regarding the preparation of these complex salts are found in copending application Ser. No. 564,421, incorporated herein by reference.

Of the aromatic iodonium complex salts which are suitable for use in the compositions of the invention the preferred salts are the diaryliodonium hexafluorophosphate and hexafluoroantimonate such as diphenyliodonium hexafluorophosphate and hexafluoroantimonate. These salts are preferred because, in general, they are more thermally stable, promote faster reaction, and are more soluble in inert organic solvents than are other aromatic iodonium salts of complex ions.

Certain aromatic sulfonium salts are known and recognized in the art. Triaryl-substituted sulfonium compounds, for example, can be prepared by the procedures described in G. H. Weigand, et al., Synthesis and Reactions of Triarylsulfonium Halides, J. Org. Chem. 33, 2671–75 (1968). The preferred method for making triaryl-substituted sulfonium compounds is described in U.S. Pat. No. 2,807,648, incorporated herein by reference, from which the complex sulfonium salts can be made. The complex sulfonium salts can be prepared from the corresponding simple salts, such as the halide salts, by exchange with the complex anion in the form of the salt or free acid.

The sulfonium complex salts are substituted with three aromatic groups such as those having 4 to 20 carbon atoms and are selected from phenyl, thienyl and furanyl groups. These aromatic groups may optionally have one or more fused benzo rings (e.g. naphthyl and the like; benzothienyl, dibenzothienyl; benzofuranyl, dibenzofuranyl; etc.). Such aromatic groups may also be substituted, if desired, by one or more neutral groups which are essentially non-reactive with epoxide and hydroxy.

Examples of suitable aromatic sulfonium complex salt photoinitiators include:
triphenylsulfonium hexafluorophosphate
triphenylsulfonium hexafluoroanitimonate
diphenylnaphthylsulfonium hexafluoroarsenate
tritolylsulfonium hexafluorophosphate
4-chlorophenyldiphenylsulfonium hexafluoroanitimonate
tris(4-phenoxyphenyl)sulfonium hexafluorophosphate The complex salts described above are dissolved in the liquid organic ester described above to form liquid solutions in which the complex salt is at a concentration of at least about 10% by weight, preferably about 20 to 50% or more by weight, depending upon the particular salt and liquid organic ester selected and the purpose for which the concentrated composition is prepared. Although the complex salt in dry form may be dissolved directly in the liquid organic ester, this is not the preferred process for preparing the compositions because it generally requires extensive heating and vigorous agitation. It is generally more convenient to prepare the complex salt by extraction from an aqueous solution or suspension followed by drying of the ester solution. A liquid composition of the invention is thereby obtained.

If desired, inert fillers may be included in the compositions of the invention in amounts up to about 25% by weight, although generally there would be no need to include fillers since these are generally added at the time of preparation of the final curable composition.

The liquid compositions of this invention are especially useful as concentrates which may be diluted many-fold with cationically-polymerizable materials, especially epoxides, to form photopolymerizable compositions. Naturally, it may be desirable to also include in such diluted compositions other reactive or non-reactive materials such as flexibilizers, viscosity modifiers, tackifying agents, flow control agents, fillers, dyes, pigments, and other conventional additives.

Some of the complex salts in the organic ester may form super-saturated liquids or waxy solids at room temperatures which melt readily with moderate heating and are also useful.

The invention is further illustrated by means of the following non-limiting examples, wherein the term "parts" refers to parts by weight unless otherwise indicated.

EXAMPLE 1

A liquid composition is prepared containing a triarylsulfonium hexafluorophosphate complex salt photoinitiator dissolved in di(methoxyethyl)orthophthalate at a concentration of 50% by weight.

The complex salt is prepared using as starting material a triarylsulfonium chloride prepared in accordance with the procedure of Example 10 of U.S. Pat. No. 2,807,648 (Pitt), incorporated herein by reference. A solution of 28.3 parts of this product in 28.3 parts of water is added to a solution of 17.8 parts of $HPF_6$ in 65.9 parts of water also containing 35.1 parts of di(methoxyethyl)orthophthalate to dissolve the complex salt precipitate. The organic phase is then separated and washed twice with 116.4 parts of deionized water. The ester solution is then dried by heating to about 60° C. at 20 torr to remove traces of water.

EXAMPLE 2

A photocurable ink is prepared using the following ingredients:

|  | Parts by Weight |
|---|---|
| Red mill base* | 4 |
| "ERL-4221" epoxy resin from Union Carbide | 0.8 |
| Triarylsulfonium hexafluorophosphate (50% solution in dibutyl phthalate) | 0.2 |

*contains essentially the following ingredients:
25.75 parts "ERL-4221"
48 parts "Epon 834", epoxy resin from Shell
22.5 parts permared 2B pigment
2.75 parts anti-misting additives

EXAMPLE 3

A photocurable ink is prepared using the ingredients, and amounts, shown in Example 2 except that the complex salt solution used is diaryliodonium hexafluorophosphate dissolved in dimethyl phthalate at a concentration of 50% by weight.

EXAMPLE 4

A photocurable varnish is prepared using the following ingredients:

|  | Parts by Weight |
|---|---|
| "ERL-4221" epoxy resin from Union Carbide | 3.75 |
| "TP440" polyoxypropylenetriol from Wyandotte | 0.75 |
| Triarylsulfonium hexafluorophosphate (20% solution in dimethylphthalate) | 0.5 |
| Nonionic fluorochemical surfactant | 0.025 |

EXAMPLE 5

A photocurable varnish is prepared using the following ingredients:

|  | Parts by Weight |
|---|---|
| "ERL-4221" | 8.1 |
| Triethylene glycol | 1.5 |
| Triarylsulfonium hexafluorophosphate (50% solution in di(methoxy ethyl) phthalate) | 0.4 |
| Nonionic fluorochemical surfactant | 0.05 |

EXAMPLE 6

A photocurable varnish is prepared using the following ingredients:

|  | Parts by Weight |
|---|---|
| "ERL-4221" | 7.6 |
| "TP-440" polyoxypropylenetriol | 2.0 |
| Triarylsulfonium hexafluorophosphate (50% solution in diethyl maleate) | 0.4 |
| Nonionic fluorochemical surfactant | 0.05 |

The compositions of Examples 2–6 are each applied to the desired substrates with, e.g., a rubber roller. The coated samples are then passed through a model QC1202 UV processor (from Radiation Polymer Company) with both 200 watt per inch medium pressure mercury vapor lamps turned on. The following results are obtained:

| Example No. | Substrate | Conveyer Speed (ft/min.) | Tack Free Time |
|---|---|---|---|
| 2 | aluminum sheet | 100 | instantly |
| 3 | aluminum sheet | 100 | instantly |
| 4 | aluminum sheet | 100 | 2–3 seconds |
| 5 | aluminum sheet | 100 | 10 seconds |
| 6 | aluminum sheet | 100 | instantly |
| 6 | clay coated paperboard | 300 | instantly |

EXAMPLES 7–19

Various organic esters were tested to determine their ability to dissolve high concentrations (i.e. 10% or more by weight) of complex salt photoinitiators. Exemplary of the esters tested are those listed in the attached Table I. The solutions of Examples 7–14 are compositions of the present invention. The organic acid precursor of the ester of Example 15 has two carboxyl groups linked together by means of a chain having three carbon atoms. The alcohol precursor of the ester of Example 16 has an oxygen to carbon ratio of less than 1:3. The ester of Example 17 has the two ester groups restrained in the trans-position by the double bond in the chain connecting them. The acid precursors of Examples 18 and 19 are aromatic dicarboxylic acids in which the two acid groups are not ortho, but respectively meta and para.

Table I

| Example No. | Organic Ester | Triarylsulfonium hexafluorophosphate | Diphenyliodonium hexafluorophosphate |
|---|---|---|---|
| 7 | dibutyl-orthophthalate | soluble at 50% | soluble at 50% |
| 8 | dimethyl-orthophthalate | soluble at 50% | soluble at 50%* |
| 9 | diethylphthalate | soluble at 50% | soluble at 20% |
| 10 | di(methoxyethyl)phthalate | soluble at 50% | soluble at 50% |
| 11 | diethyl maleate | soluble at 50% | soluble at 20% |
| 12 | diethyl oxalate | soluble at 50% | soluble at 50% |
| 13 | diethyl malonate | soluble at 50% | soluble at 50% |
| 14 | diethyl succinate | soluble at 50% | soluble at 50% |
| 15 | diethyl adipate | not soluble at 10% | soluble at 20% |
| 16 | di-n-butyl maleate | not soluble at 10% | not soluble at 10% |
| 17 | diethyl fumarate | not soluble at 10% | not soluble at 10% |
| 18 | di-n-butylisophthalate | not soluble at 10% | not soluble at 10% |
| 19 | di-n-butylterephthalate | not soluble at 10% | not soluble at 10% |

*liquid solution at 50° C.; waxy solid at room temperature

What is claimed is:

1. A composition consisting essentially of a complex salt dissolved in a liquid organic ester which is free of substituents which are reactive with cationically polymerizable groups, wherein said complex salt is present in an amount of at least 10% by weight of said composition, and wherein said complex salt is selected from diorganoiodonium complex salts and triorganosulfonium complex salts of a type capable of initiating photopolymerization of cationically polymerizable materials.

2. A composition in accordance with claim 1, wherein said liquid organic ester is an ester of (a) an aromatic acid having at least two carboxyl groups on adjacent carbon atoms of the aromatic ring and (b) an aliphatic alcohol, and wherein said liquid organic ester has a boiling point of at least about 175° C.

3. A composition in accordance with claim 2 wherein said aliphatic alcohol has an oxygen to carbon ratio of at least 1:4.

4. A composition in accordance with claim 3, wherein said liquid organic ester comprises an „thophthalate ester.

5. A composition in accordance with claim 1, wherein said liquid organic ester is an ester of (a) an aliphatic acid having at least two carboxyl groups linked directly or by means of a chain having 1 or 2 carbon atoms, and (b) an aliphatic alcohol having an oxygen to carbon ratio of at least 1:3.

6. A composition in accordance with claim 5 wherein said aliphatic acid is selected from oxalic, malonic, maleic, succinic, oxydiacetic and glutaric.

7. A composition in accordance with claim 4, wherein said ester is benzylalkylphthalate.

* * * * *

UNITED STATES PATENT AND TRADEMARK OFFICE
CERTIFICATE OF CORRECTION

PATENT NO. : 4,231,886
DATED : November 4, 1980
INVENTOR(S) : Robert C. Carlson

It is certified that error appears in the above—identified patent and that said. Letters Patent is hereby corrected as shown below:

Col. 3, line 62, "$X^{31}$" should read -- $X^-$ -- .

Col. 7, line 10, in Table I, Example No. 7, third column, insert asterisk after -- soluble at 50% --.

Claim 4, line 24, ",,thophthalate" should read -- orthophthalate -- .

Signed and Sealed this

Twelfth Day of May 1981

[SEAL]

Attest:

RENE D. TEGTMEYER

Attesting Officer     Acting Commissioner of Patents and Trademarks